United States Patent
Nezuka

(10) Patent No.: US 9,281,837 B2
(45) Date of Patent: Mar. 8, 2016

(54) A/D CONVERTER

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/819,767

(22) Filed: Aug. 6, 2015

(65) Prior Publication Data

US 2016/0043733 A1    Feb. 11, 2016

(30) Foreign Application Priority Data

Aug. 7, 2014  (JP) .................................. 2014-161666

(51) Int. Cl.
*H03M 3/00* (2006.01)
*H03M 1/12* (2006.01)
*H03M 1/00* (2006.01)

(52) U.S. Cl.
CPC .............. *H03M 3/496* (2013.01); *H03M 3/368* (2013.01); *H03M 3/464* (2013.01); *H03M 1/00* (2013.01); *H03M 1/12* (2013.01); *H03M 3/30* (2013.01)

(58) Field of Classification Search
CPC ............ H03M 3/30; H03M 1/12; H03M 1/00
USPC .......................... 341/143, 155, 156, 120, 163
See application file for complete search history.

(56) References Cited

U.S. PATENT DOCUMENTS

| | | | |
|---|---|---|---|
| 5,844,514 A | 12/1998 | Ringh et al. | |
| 7,205,921 B1 * | 4/2007 | Savla | H03M 1/145 341/155 |
| 7,289,054 B1 | 10/2007 | Watanabe | |
| 7,504,977 B2 | 3/2009 | Doorenbos et al. | |
| 7,511,648 B2 | 3/2009 | Trifonov et al. | |

OTHER PUBLICATIONS

Rombouts et al., "A 13.5-b 1.2-V Micropower Extended Counting A/D Converter" IEEE Journal of Solid-State Circuits, vol. 36, No. 2, Feb. 2001, pp. 176-183. (discussed on p. 1 of the specification).
Schott et al., "CMOS Single-Chip Electronic Compass With Microcontroller" IEEE Journal of Solid-State Circuits, vol. 42, No. 12, Dec. 2007, pp. 2923-2933.

(Continued)

*Primary Examiner* — Joseph Lauture
(74) *Attorney, Agent, or Firm* — Posz Law Group, PLC

(57) ABSTRACT

An A/D converter includes a delta-sigma processing circuit for A/D conversion by delta-sigma modulation, and a cyclic processing circuit for A/D conversion by cyclic processing of amplification of a residue generated in the A/D conversion. The A/D converter further includes a quantization part for outputting a quantized value of quantized output of the delta-sigma processing circuit and a quantized output of the cyclic processing circuit, and a control circuit for generating an A/D conversion result and switching over a reference voltage based on the quantized value. The delta-sigma processing circuit and the cyclic processing circuit include a sampling capacitor, an integration capacitor and a capacitive D/A converter, which includes a DAC capacitor and add and subtract a charge corresponding to a reference voltage to and from a residue of quantization. The sampling capacitor, the DAC capacitor and the integration capacitor are provided as electrically separate capacitors.

6 Claims, 11 Drawing Sheets

(56) References Cited

OTHER PUBLICATIONS

De Maeyer et al., "A Double-Sampling Extended-Counting ADC" IEEE Journal of Solid-State Circuits, vol. 39, No. 3, Mar. 2004, pp. 411-418.

Jansson. "A High-Resolution, Compact, and Low-Power ADC Suitable for Array Implementation in Standard CMOS" IEEE Transactions on Circuits and Systems-I: Fundamental Theory and Applications, vol. 42, No. 11, Nov. 1995, pp. 904-912.

Jansson. "A High-Resolution, Compact, and Low-Power ADC Suitable for Multi-Channel Implementation: Measurements and Methods of Self-Calibration" Symposium on VLSI Circuits Digest of Technical Papers, 1996, pp. 92-93.

Mulliken et al., "Delta-Sigma Algorithmic Analog-to-Digital Conversion" IEEE International Symposium on Circuits and Systems, vol. 4, 2002. ISCAS 2002, pp. 687-690.

Kun et al., "A Dynamic Reconfigurable A/D Converter for Sensor Applications" IEEE, 2005. pp. 1221-1224.

\* cited by examiner

_US 9,281,837 B2_

A/D CONVERTER

CROSS REFERENCE TO RELATED APPLICATION

The present application is based on Japanese patent application No. 2014-161666 filed on Aug. 7, 2014, content of which is incorporated herein by reference.

FIELD

The present disclosure relates to an A/D converter, which includes two conversion systems of a delta-sigma processing system and a cyclic processing system.

BACKGROUND

As a result of progress in digital communication and signal processing, a high-speed and high-accuracy A/D converter (ADC) is needed to meet rapidly expanding communication bandwidth and higher speed processing.

For example, an ADC disclosed in IEEE Journal of Solid-State Circuits, Vol. 36, No. 2, February 2001 includes two conversion systems, which are a delta-sigma ($\Delta\Sigma$) processing system and a cyclic processing system. The delta-sigma processing system has higher accuracy than the cyclic processing system. The cyclic processing system has higher conversion speed than the delta-sigma processing system. In a device incorporating such an ADC, the delta-sigma processing system is used to convert most significant-side bits, which need be converted accurately, and the cyclic processing system is used to convert least significant-side bits, which need be converted speedily.

The ADC disclosed in the above-referred document includes a capacitive D/A converter (DAC) for a feedback of quantized results. This capacitive DAC includes a first DAC, which feeds back quantized results to a circuit of delta-sigma processing, as well as a second DAC and a third DAC, which feed back the quantized results to circuits of cyclic processing. A capacitor of the first DAC is used as not only a sampling capacitor in the delta-sigma processing but also an integration capacitor in the cyclic processing. Capacitors of the second and third DACs are used as sampling capacitors in the cyclic processing.

For this reason, when leak currents are generated in the DACs and in switches, which turn on and off in the sampling operation and the integration operation, accuracies of sampling and feedback operations are lowered thereby lowering the accuracy of A/D conversion. The leak current of a switch, which is formed of a MOS or MOSs, for example, increases generally as a semiconductor device is manufactured with highly micronized technology. As a result, the leak current affects more on the accuracy of A/D conversion as more micronized manufacturing technology is used.

SUMMARY

It is therefore an object to provide an A/D converter, which maintains high accuracy of conversion while including two conversion systems of a delta-sigma processing system and a cyclic processing system.

According to one aspect, an A/D converter comprises a delta-sigma processing circuit, a cyclic processing circuit, a quantization circuit and a control circuit. The delta-sigma processing circuit receives an analog input signal for A/D conversion of the analog input signal by delta-sigma processing of delta-sigma modulation. The cyclic processing circuit processes A/D conversion of a residue of quantization generated in the A/D conversion, by cyclic operation of amplification of the residue and subtraction of a reference voltage from an amplified residue. The quantization circuit outputs a quantized value of a quantized output of the delta-sigma processing circuit and a quantized output of the cyclic processing circuit. The control circuit generates an A/D conversion result of the analog input signal based on the quantized value and outputs control signals for switching over the reference voltage.

The delta-sigma processing circuit and the cyclic processing circuit include an operational amplifier forming an operation circuit, sampling capacitors, a capacitive D/A converter having a DAC capacitor for adding and subtracting the reference voltage corresponding to the control signals from residue of quantization. The delta-sigma processing circuit includes an integration capacitor used for the delta-sigma processing and the cyclic processing. The sampling capacitors, the DAC capacitor and the integration capacitor are provided to be electrically separated.

EMBODIMENT

Figure 1:
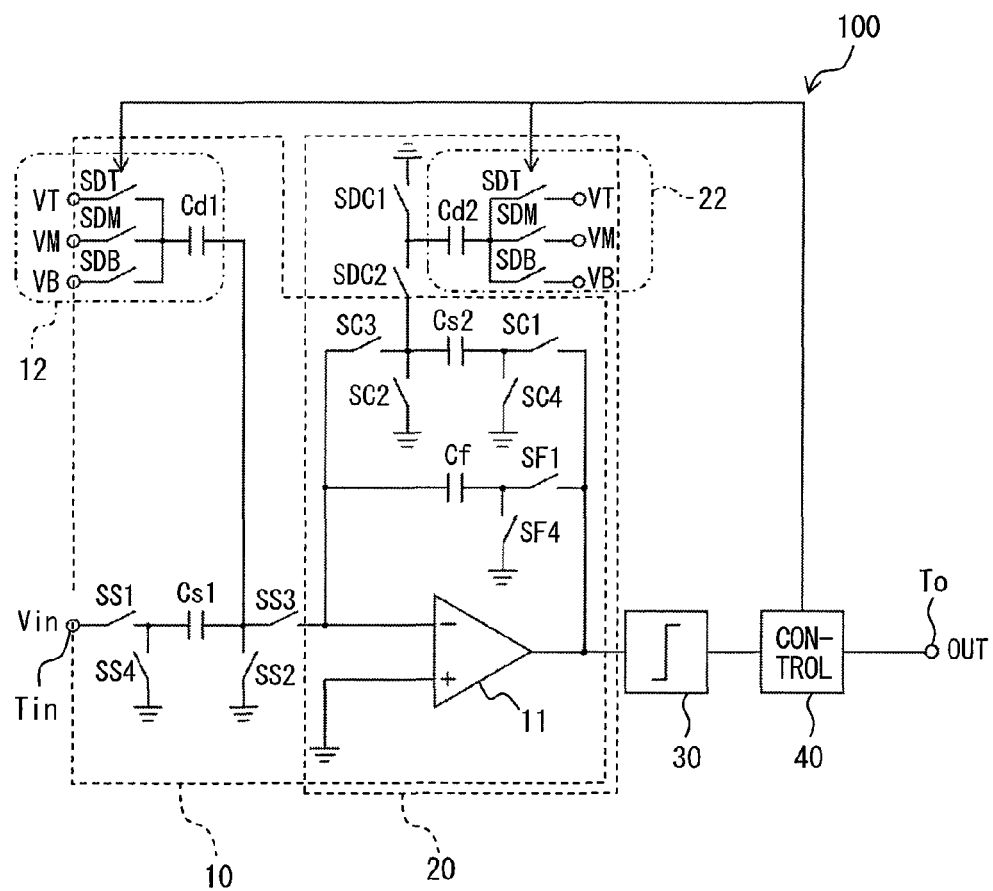
FIG. 1 is a circuit diagram showing a first embodiment of an A/D converter.

An A/D converter will be described below with reference to embodiments shown in the drawings. In the drawings, same reference numerals are assigned to designate the same or similar parts.

First Embodiment

In a first embodiment, an A/D converter is configured generally as shown in FIG. 1 and designated with reference numeral 100.

This A/D converter 100 includes two conversion systems, which are a delta-sigma ($\Delta\Sigma$) processing system for performing a delta-sigma modulation operation and a cyclic processing system for performing cyclic operation. The A/D converter 100 is a hybrid type A/D converter, which operates to switch over the A/D conversions between the delta-sigma processing system and the cyclic processing system in accordance with required accuracy of A/D conversion.

Specifically, the A/D converter 100 is formed of a delta-sigma (ΔΣ) processing circuit 10, a cyclic processing circuit 20, a quantization circuit 30 and a control circuit 40. The delta-sigma processing circuit 10 operates to process, as its processing object, an analog input signal Vin inputted thereto. The cyclic processing circuit 20 operates to process, as its processing object, a residue (residual charge) of quantization performed by the circuit. The operations of the A/D converter 100 under the delta-sigma processing system and the cyclic processing system are referred to as a delta-sigma processing and a cyclic processing, respectively.

A non-inverting input terminal (+) of an operational amplifier 11, which is provided in common in the delta-sigma processing circuit 10 and the cyclic processing circuit 20, is connected to ground exemplarily. However, for higher accuracy of A/D conversion, the operational amplifier 11 may be configured as a differential amplifier, which receives analog input signals Vin(+) and Vin(−) of opposite polarities at its input terminals. In the first embodiment, for simplified description, the operational amplifier 11 is shown with its non-inverting input terminal being grounded.

The delta-sigma processing circuit 10 includes, an analog input terminal Tin for receiving an analog input signal Vin, the operational amplifier 11, a first sampling capacitor Cs1, an integration capacitor Cf and a second sampling capacitor Cs2 and a first D/A converter (DAC) 12. The integration capacitor Cf and the second sampling capacitor Cs2 form feedback circuits.

The analog input terminal Tin is connected to an inverting input terminal of the operational amplifier 11 through the first sampling capacitor Cs1. The non-inverting input terminal of the operational amplifier 11 is connected to an analog ground (AGND). An output terminal of the operational amplifier 11 is connected to the quantization circuit 30.

A switch SS1 is connected between the first sampling capacitor Cs1 and the analog input terminal Tin. When the switch SS1 is turned on, an electric charge corresponding to the analog input signal is stored in the first sampling capacitor Cs1. A changeover switch SS3 is connected between the operational amplifier 11 and the first sampling capacitor Cs1. When the changeover switch SS3 is turned off, the first sampling capacitor Cs1 and the operational amplifier 11 are separated, that is, disconnected, electrically.

The integration capacitor Cf forms one feedback circuit from the output terminal of the operational amplifier 11 to the inverting input terminal of the operational amplifier 11. The second sampling capacitor Cs2 forms the other feedback circuit in parallel to the integration capacitor Cf. The integration capacitor Cf and the second sampling capacitor Cs2 form an integration circuit jointly with the first sampling capacitor Cs1 and a first DAC capacitor Cd1 described below. In the delta-sigma processing, a charge, which remains as a result of removal of a charge corresponding to a reference voltage (either one of voltages VT, VM and VB) supplied from the first D/A converter 12 from the charge stored in the first sampling capacitor Cs1, is transferred to the integration capacitor Cf and the second sampling capacitor Cs2 and stored as a residual charge (residue). In addition, one end of the integration capacitor Cf is connected directly to the inverting input terminal of the operational amplifier 11. That is, the one end of the integration capacitor Cf is connected to the inverting input terminal side through no switches. As a result, without on-resistance of a switch the circuit is made to perform its processing at high speeds.

The first D/A converter 12 is connected to the changeover switch SS3 in parallel relative to the first sampling capacitor Cs1. The first D/A converter 12 is a capacitive type converter including the first DAC capacitor Cd1. One end of the first DAC capacitor Cd1 is connected to the inverting input terminal of the operational amplifier 11 through the changeover switch SS3. The other end of the first DAC capacitor Cd1 is connected to receive the reference voltage VR through switches SDT, SDM and SDB. Reference voltages VT, VM and VB correspond to D/A converted values of the output of quantization circuit 30 and satisfy the relation, VT>VM>VB, for example. The reference voltage VR is not limited to three levels but may be set arbitrarily in accordance with the number of levels of values quantized by the quantization circuit 30.

Further, the delta-sigma processing circuit 10 includes a switch SS2, one end and the other end of which is connected to AGND and a node between the changeover switch SS3 and the first sampling capacitor Cs1, respectively. In the delta-sigma processing excluding a transition period for transition from the delta-sigma processing to the cyclic processing, the switches SS1 and SS2 are turned on to sample the analog input signal Vin in the first sampling capacitor Cs1.

Further, the delta-sigma processing circuit 10 includes a switch SS4, one end and the other end of which are connected to AGND and a node between the switch SS1 and the first sampling capacitor Cs1, respectively. The switch SS4 operates in reverse to the switch SS1. That is, when the switch SS1 is turned on and off, the switch SS4 is turned off and on, respectively. In integration operation in the delta-sigma processing, the switch SS4 connects the first sampling capacitor Cs1 to ANGD and transfers the analog input signal sampled in the first sampling capacitor Cs1 to the integration capacitor Cf and the first sampling capacitor Cs1 through the changeover switch SS3. The control circuit 40 controls appropriately on-off timing of each switch SS1, SS2, SS3, SS4 so that the switches SS1 and SS4 do not turn on at the same time and the switches SS2 and SS3 do not turn on at the same time.

The cyclic processing circuit 20 includes the operational amplifier 11, the integration capacitor Cf, the second sampling capacitor Cs2 and a second D/A converter 22. The operational amplifier 11, the integration capacitor Cf and the second sampling capacitor Cs2 are connected in the same way as in the delta-sigma processing circuit 10, that is, used in common for both the delta-sigma processing circuit 10 and the cyclic processing circuit 20.

The second D/A converter 22 is connected in parallel to the second sampling capacitor Cs2 relative to the inverting input terminal of the operational amplifier 11. The second D/A converter 22 is a capacitive type D/A converter including a second DAC capacitor Cd2. One end of the second DAC capacitor Cd2 is connected to the inverting input terminal of the operational amplifier 11 through a switch SC3. The other end of the second DAC capacitor Cd2 is connected to receive the reference voltage VR through switches SDT, SDM and SDB. The reference voltage VR is controlled by the output of the quantization circuit 30 in the same way as in the first D/A converter 12. The switches SDT, SDM and SDB in the second D/A converter 22 are designated with the same reference numerals as in the first D/A converter 12. However, each of the switches SDT, SDM and SDB are operated to turn on and off independently under control of the control circuit 40 between the first D/A converter 12 and the second D/A converter 22.

The second D/A converter 22 is connected to a node between the switch SC3 and the second sampling capacitor Cs2. That is, the second D/A converter 22 is connected to the feedback circuit forming the delta-sigma processing circuit 10. The second D/A converter 22 is electrically separable from the feedback circuit by a separation switch SDC2. One end of the second DAC capacitor Cd2, which is not connected to the switches SDT, SDM and SDB, is connectable to the AGND through a switch SDC1. That is, when the A/D converter 100 performs the delta-sigma processing, the separation switch SDC2 is turned off to separate the second D/A converter 22 from the feedback circuit, which forms the integration circuit. The separation switch SDC2 is directly connected to the second sampling capacitor Cs2 through no other switch.

The cyclic processing circuit 20 includes a switch SF1 between the integration capacitor Cf and the output terminal of the operational amplifier 11. The integration capacitor Cf is connectable to the AGND through a switch SF4, which is connected to the switch SF1 in parallel relative to the integration capacitor Cf.

The cyclic processing circuit 20 includes the switch SC1 in parallel to the switch SF1 relative to the output terminal of the operational amplifier 11 between the second sampling capacitor Cs2 and the output terminal of the operational amplifier 11. The second sampling capacitor Cs2 is connectable to the AGND through the switch SC4 connected in parallel to the switch SC1 relative to the second sampling capacitor Cs2. Further, the second sampling capacitor Cs2 is connectable to the AGND through the switch SC2 connected in parallel to the switch SC3 and the separation switch SDC2 relative to the second sampling capacitor Cs2.

In the cyclic processing excluding the transition period for transition from the delta-sigma processing to the cyclic processing, the cyclic processing circuit 20 samples the output signal of the operational amplifier 11 by turning on the switch SC2 and the switch SC1 and amplifies the output signal of the operational amplifier 11 with the switch SC3 and the switch SC4 being operated in reverse to the switch SC1.

The quantization circuit 30 is a quantizer, which quantizes the output of the operational amplifier 11, that is, the output voltage of the delta-sigma processing circuit 10 and the cyclic processing circuit 20. The quantization circuit 30 is a conventional circuit, which generates a quantized value as digital data with 1.5 bits (three levels) resolution. The switches SDT, SDM and SDB are turned on and off so that the first D/A converter 12 and the second D/A converter 22 generate the reference voltage VR in correspondence to the quantized value. The resolution of the quantization circuit 30, is not limited to 1.5 bits but may be 1 bit, 2 bits or more bits. The number of levels of the reference voltage VR, which are settable by the D/A converters 12 and 22, in accordance with the resolution of the quantization circuit 30.

The control circuit 40 generates an A/D conversion result OUT in correspondence to the quantized value generated by the quantization circuit 30 and outputs switch control signals to switch over the reference voltage VR. The A/D conversion result thus generated is outputted from a digital output terminal To. The control circuit 40 controls on-off operations of the above-described switches in the A/D converter 100.

The operation of the A/D converter 100 according to the first embodiment will be described next with reference to FIG. 2 to FIG. 9. In FIG. 3 to FIG. 9 showing electric connections, bold lines indicate electric connection made by switches, which are turned on, to connect electric circuit components such as capacitors.

Figure 2:
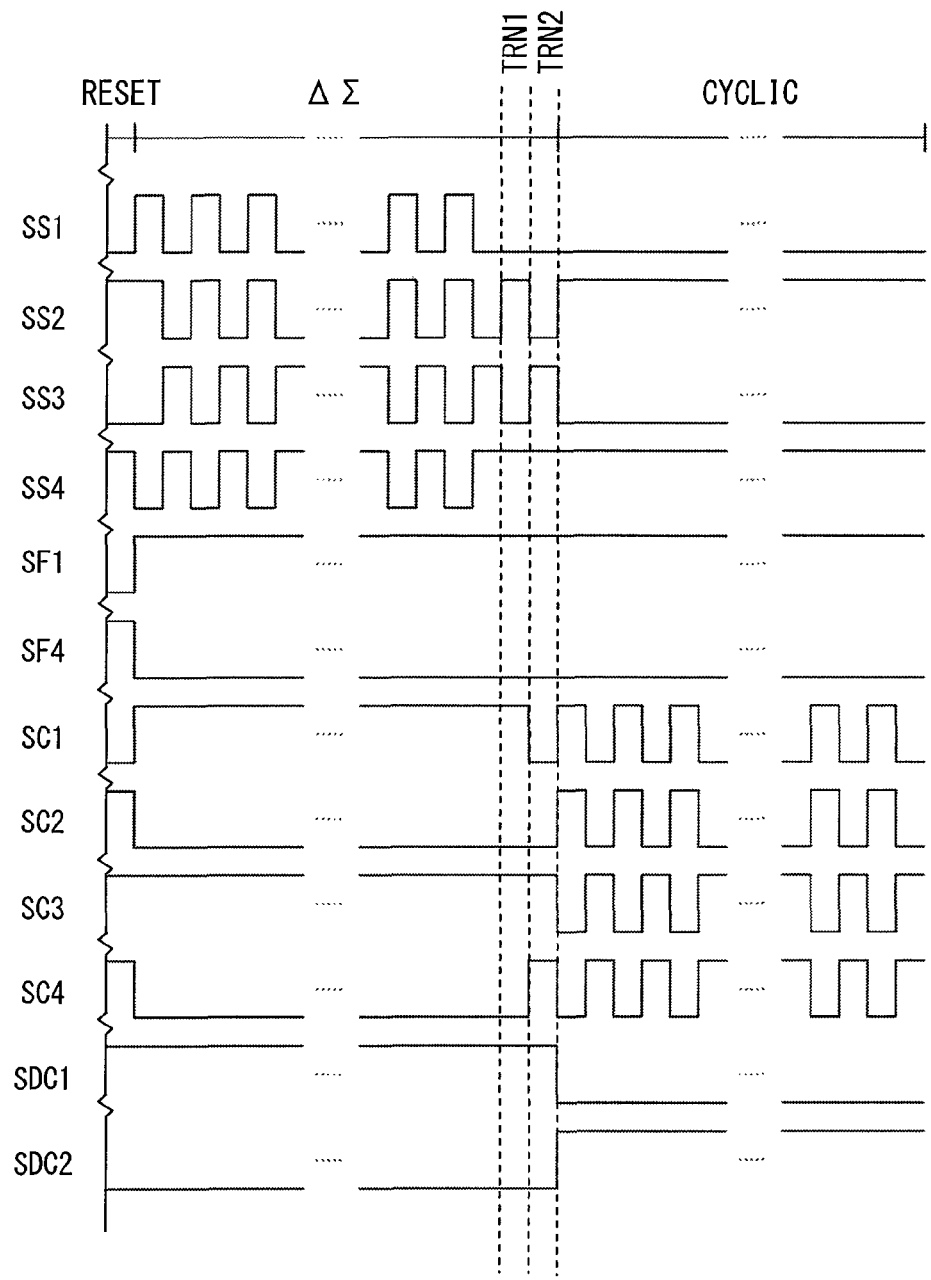
FIG. 2 is a time chart showing an operation of the first embodiment in time sequence.

As shown in FIG. 2, which is a time chart showing the operation of the A/D converter 100 in time sequence, the A/D converter 100 performs the reset operation first, the delta-sigma processing then and the cyclic processing through the transition processing from the delta-sigma processing to the cyclic processing. The delta-sigma processing includes the sampling operation for sampling the analog input signal and the integration operation for integrating the sampled signal. The transition processing includes two steps for transferring the residue generated in the delta-sigma processing to the cyclic processing circuit 20. The cyclic processing includes the sampling operation for sampling the residue generated in the delta-sigma processing and the amplification operation for amplifying the sampled signal. In FIG. 2, the switches are shown as being switched over simultaneously for simplicity. However, the switches should be switched over exclusively with appropriate intervals to avoid shorting of signals.

<Reset Operation>

Figure 3:
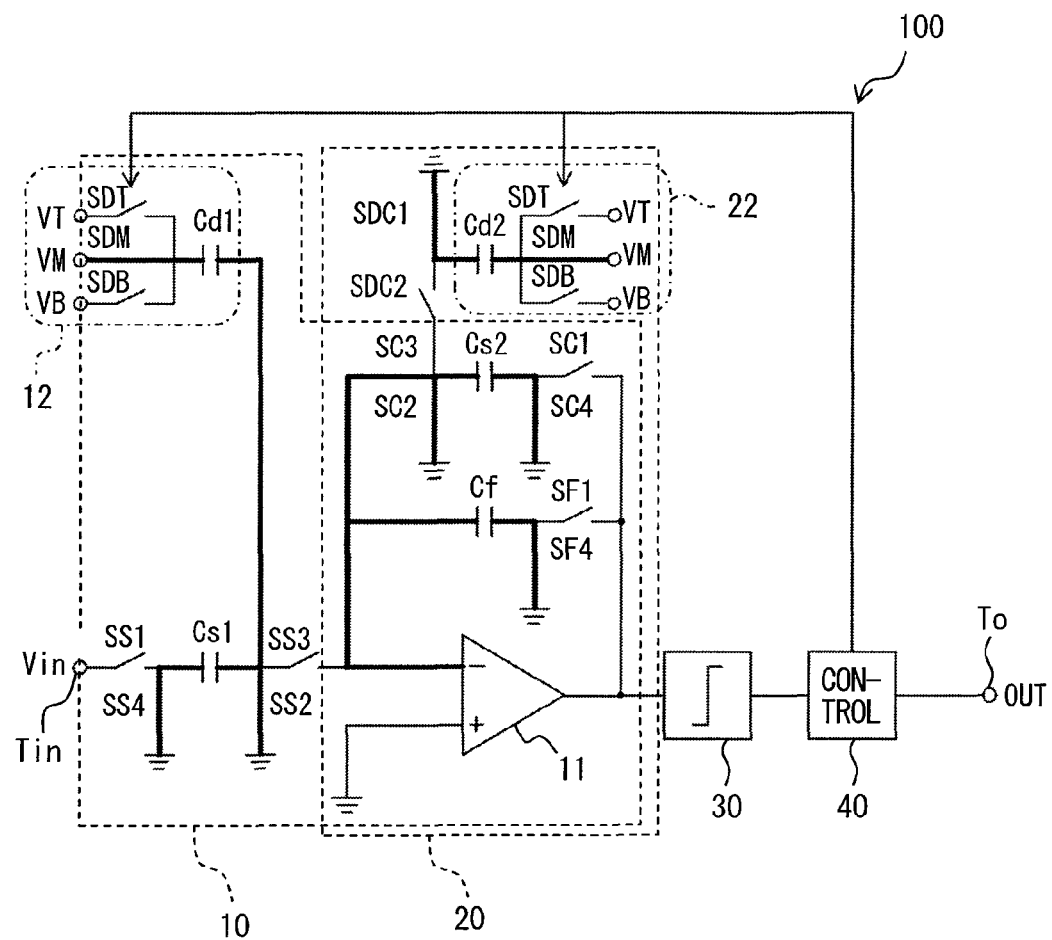
FIG. 3 is a circuit diagram showing electric connections in a reset operation of the first embodiment.

The reset operation is performed before the A/D conversion is started. The reset operation is for resetting electric charges stored in all capacitors provided in the A/D converter 100. As shown in FIG. 2, the switches SS2, SS4, SF4, SC2, SC4, SDC1 and SDM are turned on and all other switches are turned off by the control circuit 40. In this state, as shown in FIG. 3, both ends of the capacitors Cs1, Cs2, Cf, Cd1 and Cd2 are all connected to the AGND. As a result, the capacitors Cs1, Cs2, Cf, Cd1 and Cd2 are all reset so that all stored charges are discharged.

<Sampling Operation in Delta-Sigma Processing>

Figure 4:
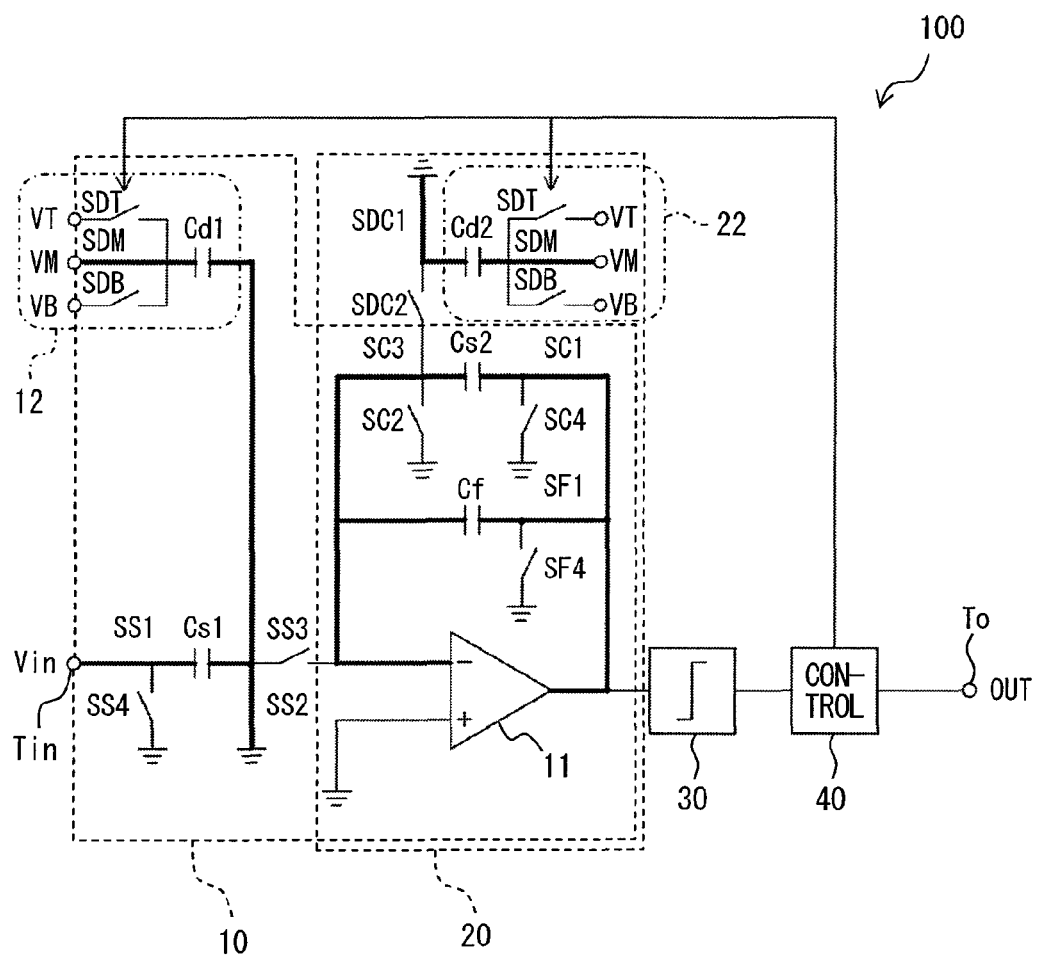
FIG. 4 is a circuit diagram showing electric connections in a sampling operation in a delta-sigma processing of the first embodiment.

After resetting, the sampling operation in the delta-sigma processing is performed. The sampling operation in the delta-sigma processing is for sampling the analog input signal Vin. As shown in FIG. 2, the switches SS1, SS2, SF1, SC1, SC3, SDC1 and SDM are turned on and all other switches are turned off by the control circuit 40. In this state, as shown in FIG. 4, the switches SS1 and SS2 are turned on to store the charge corresponding to the analog input signal Vin in the first sampling capacitor Cs1. Further, the switches SC1, SC3 and SF1 are turned on with the switches SC2, SC4 and SF4, which are connected to the AGND, being in the off-states. Thus the second sampling capacitor Cs2 and the integration capacitor Cf form a loop between the output terminal and the inverting input terminal of the operational amplifier 11, while holding respective stored charges. The operational amplifier 11 thus outputs the output voltage corresponding to the charges stored in the second sampling capacitor Cs2 and the integration capacitor Cf.

<Integration Operation in Delta-Sigma Processing>

The integration operation is performed after the sampling operation. The integration operation in the delta-sigma processing is for transferring a charge, which is produced by subtracting ($\Delta$) the charge determined by the reference voltage VR from the charge stored in the first sampling capacitor Cs1 in the sampling operation, to the second sampling capacitor Cs2 and the integration capacitor Cf and then integrating ($\Sigma$) the transferred charge.

Figure 5:
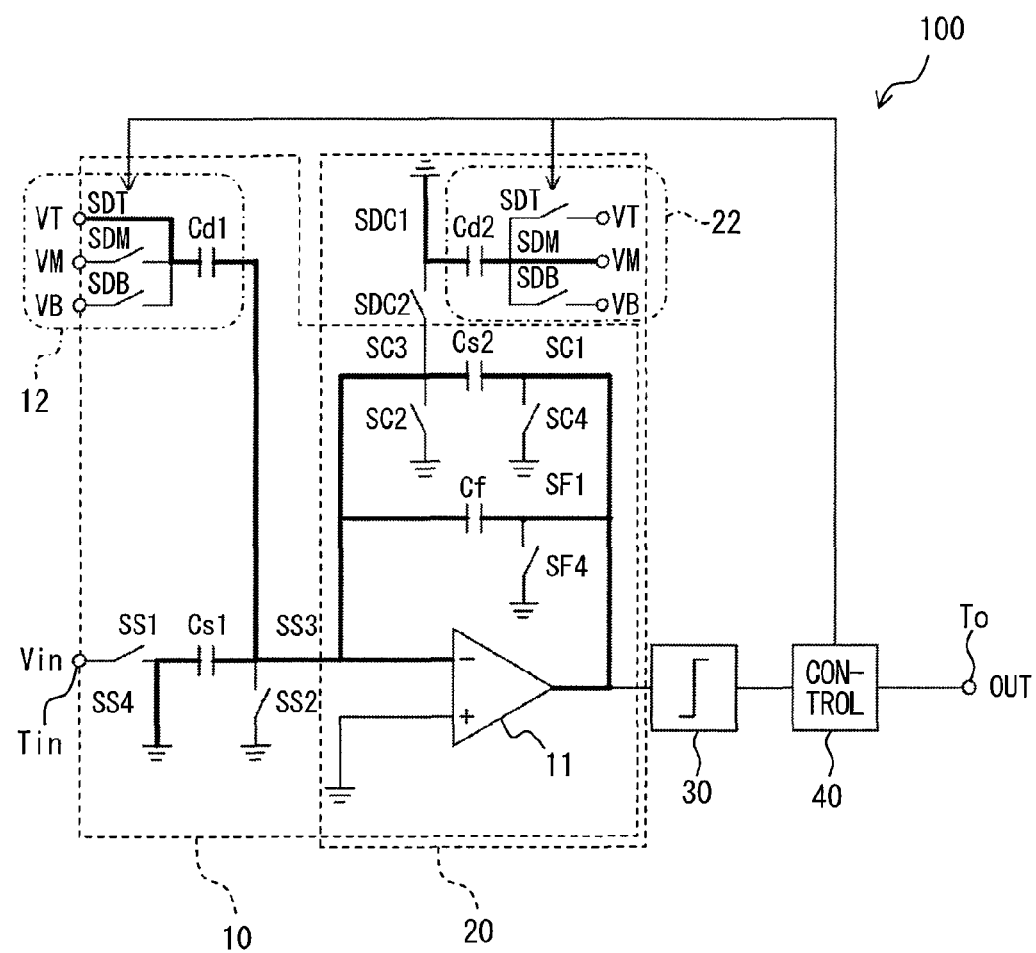
FIG. 5 is a circuit diagram showing electric connections in an integration operation in the delta-sigma processing of the first embodiment.

Specifically, relative to the sampling operation, the switches SS1, SS2 are turned off and the switches SS3, SS4 are turned on. At the same time, either one of the switches SDT, SDM, SDB in the first D/A converter 12 is turned on in accordance with the quantized value of the quantization circuit 30 so that the quantized result is fed back. In this integration operation, since the switches SS1 is turned off and the switch SS4 is turned on as shown in FIG. 5, the analog input signal Vin is not sampled. Further, since the switch SS3 is turned on, the operational amplifier 11, the first sampling capacitor Cs1, the second sampling capacitor Cs2, the first DAC capacitor Cd1 and the integration capacitor Cf form the integration circuit. As a result, the second sampling capacitor Cs2 and the integration capacitor Cf store the residual charge, which is a difference determined by removing the charge corresponding to the reference voltage VR supplied from the first D/A converter 12 from the charge stored in the first sampling capacitor Cs1 in the sampling operation.

In the delta-sigma processing, the sampling operation and the integration operation described above are repeated a predetermined number of times thereby to perform the A/D conversion. As shown in FIG. 2, the separation switch SDC2 is always turned off in the delta-sigma processing. Thus the second D/A converter 22 is in the state separated from the integration circuit provided for the delta-sigma modulation. As a result, it is possible to reduce lowering of the feedback factor and increase of thermal noise, which arise when the second DAC capacitor Cd2 is connected in the delta-sigma processing.

<First Transition from Delta-Sigma Processing to Cyclic Processing>

Figure 6:
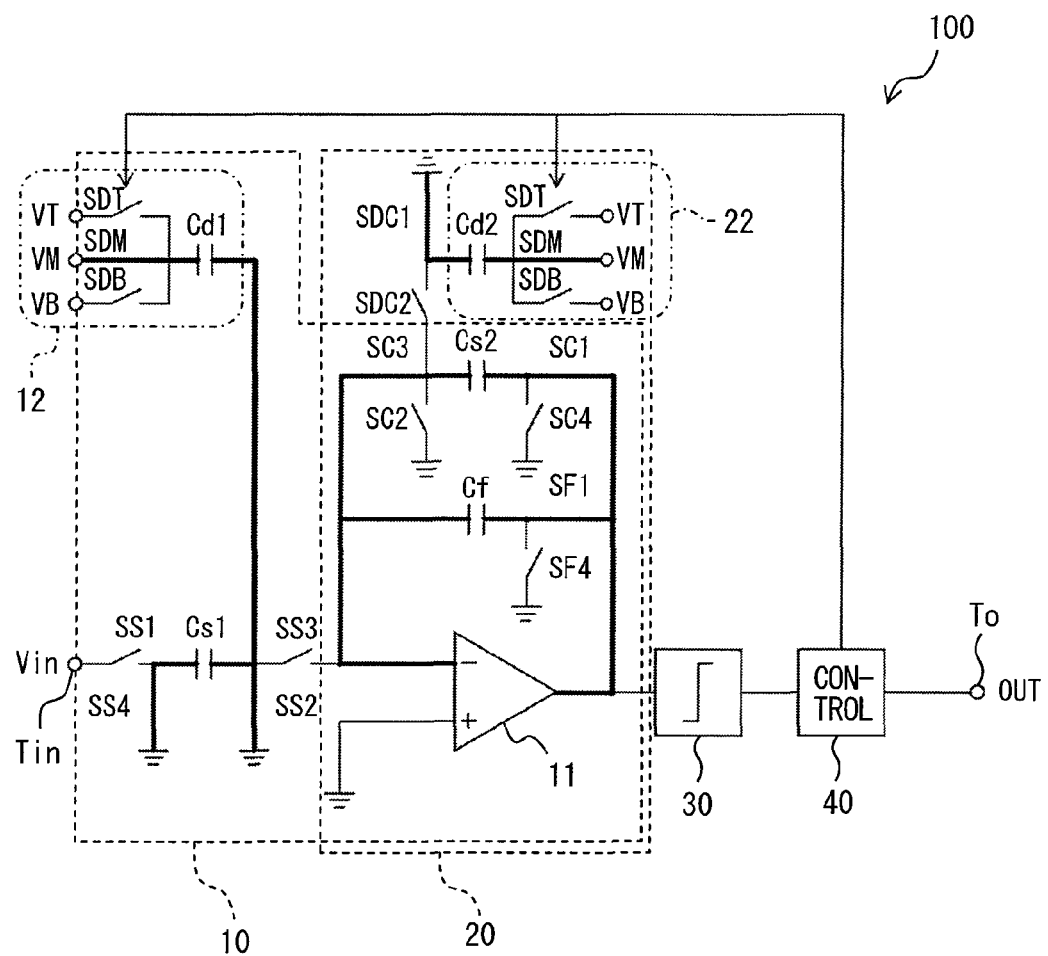
FIG. 6 is a circuit diagram showing electric connections in a transition from the delta-sigma processing to the cyclic processing of the first embodiment.

In a period of a first transition TRN1 shown in FIG. 2, that is, in the last sampling operation in the delta-sigma processing, the switch SS1 is turned off and the switch SS4 is turned on relative to the normal sampling operation. That is, as shown in FIG. 6, the analog input terminal Tin is not connected to the first sampling capacitor Cs1 and the analog input signal Vin is not sampled. In this transition, since no sampling is performed, the number of sampling in the delta-sigma processing and the number of feedback in the first D/A converter 12 are set to be equal.

<Second Transition from Delta-Sigma Processing to Cyclic Processing>

Figure 7:
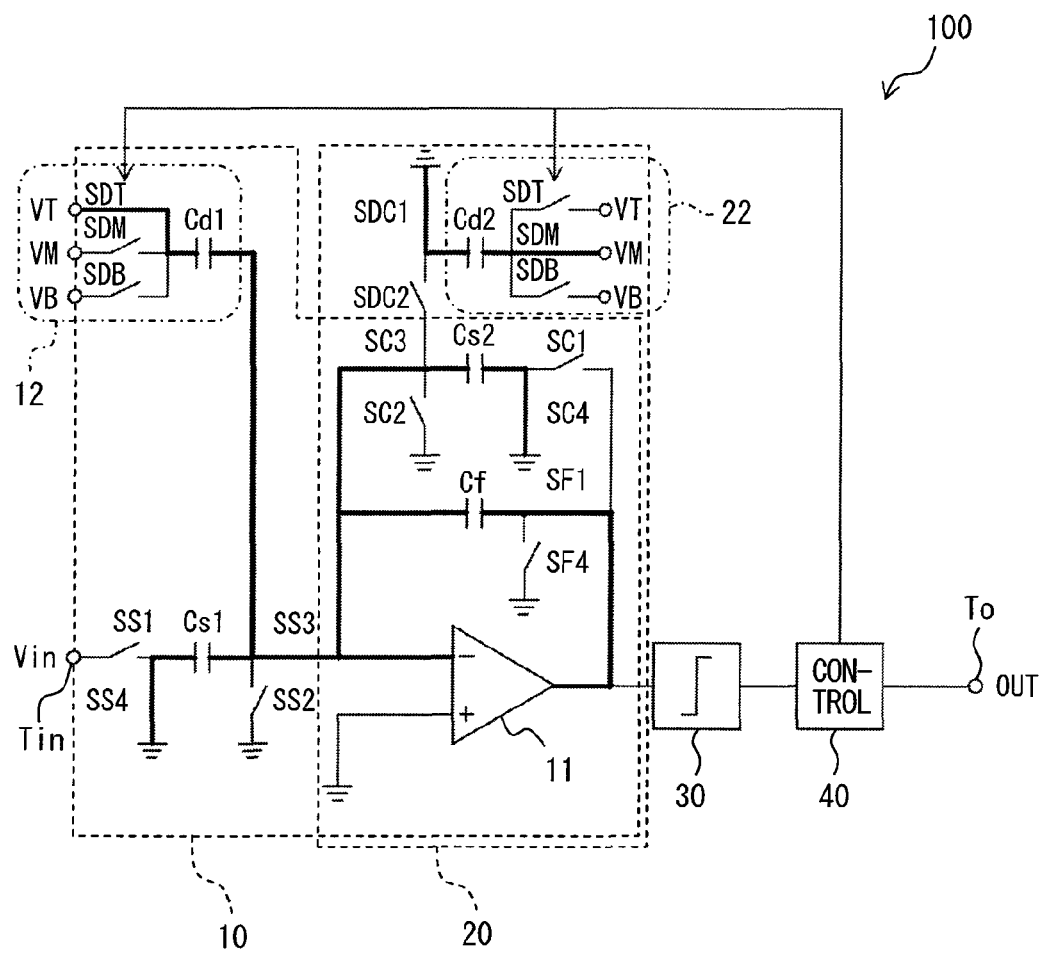
FIG. 7 is a circuit diagram showing electric connections in a transition from the delta-sigma processing to the cyclic processing of the first embodiment.

In a period of a second transition TRN2 shown in FIG. 2, that is, in the last integration operation in the delta-sigma processing, the last feedback of the quantized result of the delta-sigma processing is performed. Further, as shown in FIG. 7, the switch SC1 is turned off and the switch SC4 is turned on relative to the normal integration operation thereby to transfer the charge stored in the second sampling capacitor Cs2 to the integration capacitor Cf. Thus all the residual charges in the delta-sigma processing are transferred to the integration capacitor Cf.

Transferring the charge from the first sampling capacitor Cs1 and the first DAC capacitor Cd1 to the integration capacitor Cf is performed simultaneously, that is, at the same time as turning off of the switch SC1 and turning on of the switch SC4. However, those operations may be performed at different timing with modified control sequence. For example, after completion of transferring the charge to the integration capacitor Cf and before turning off of the switch SC1 and turning on the switch SC4, the changeover switch SS3 may be turned off.

<Sampling Operation in Cyclic Processing>

The cyclic processing is started after the last integration operation (second transition TRN2) in the delta-sigma processing. The sampling operation in the cyclic processing is for sampling the output voltage of the operational amplifier 11 to the second sampling capacitor Cs2.

Figure 8:
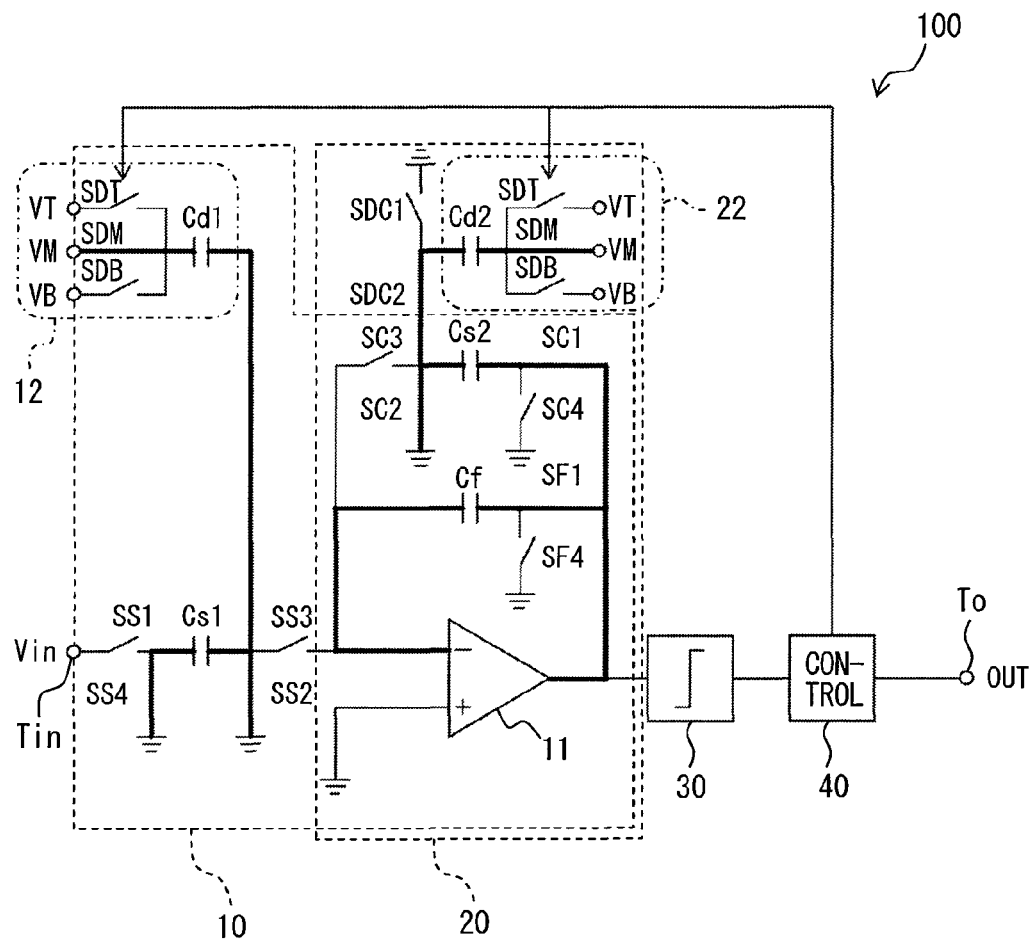
FIG. 8 is a circuit diagram showing electric connections in the sampling operation in the cyclic processing of the first embodiment.

Specifically, as shown in FIG. 2 and FIG. 8, the switches SS2, SS4, SF1, SC1, SC2, SDC2, SDM are turned on and all other switches are turned off by the control circuit 40. In this state, as shown in FIG. 8, the second sampling capacitor Cs2 is charged with the output voltage of the operational amplifier 11. The separation switch SDC2 is turned on to enable the second D/A converter 22. In the cyclic processing, the changeover switch SS3 is always turned off. Further, the first sampling capacitor Cs1 and the first D/A converter 12, which operate in the delta-sigma processing, are separated from the cyclic processing circuit 20. Thus, it is possible in the cyclic processing to reduce lowering of the feedback factor and increase of noise, which arise in the cyclic processing performed with the first sampling capacitor Cs1 and the first DAC capacitor Cd1. The switches SS2 and SS4 are always turned on and the potentials at both ends of the first sampling capacitor Cs1 are fixed to the AGND. The operational amplifier 11 outputs the output voltage, which corresponds to the charge stored in the second sampling capacitor Cs2 and the integration capacitor Cf.

<Amplification Operation in Cyclic Processing>

Figure 9:
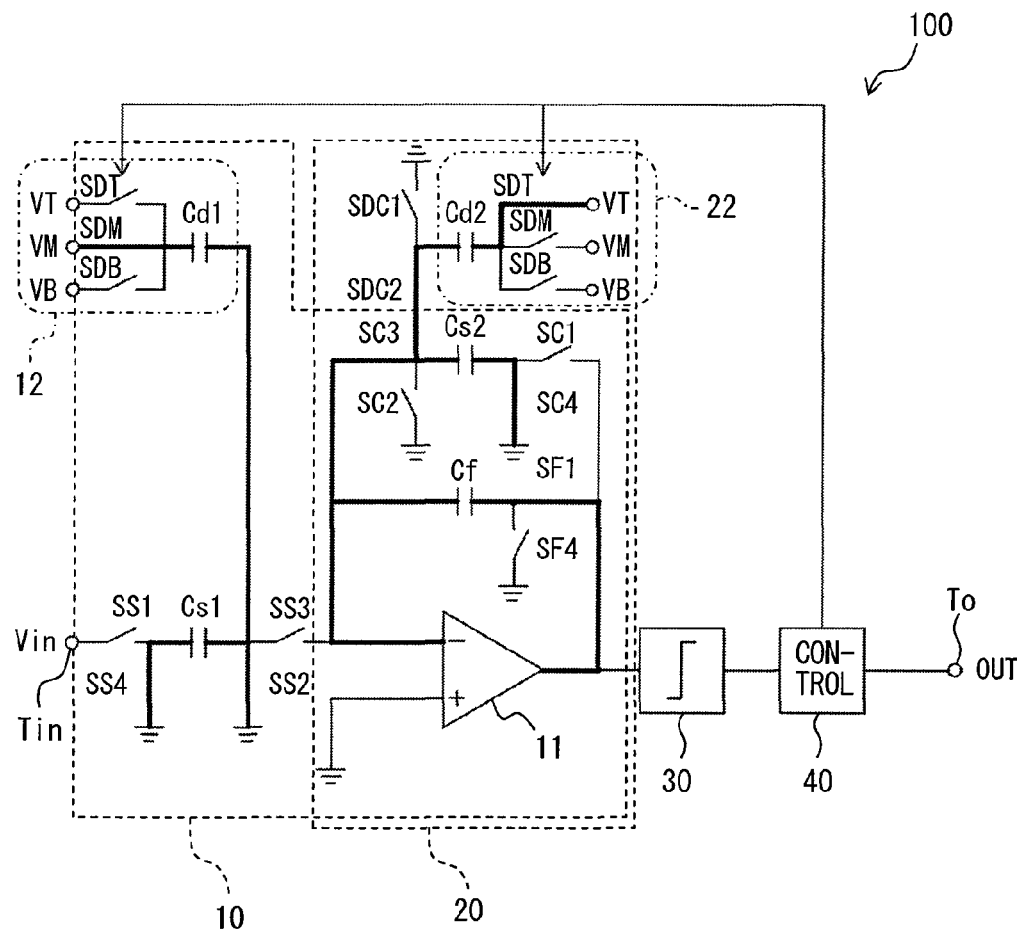
FIG. 9 is a circuit diagram showing electric connections in an amplification operation in the cyclic processing of the first embodiment.

After the sampling operation, the amplification operation is performed. Specifically, as shown in FIG. 2 and FIG. 9, the switches SC1, SC2 are turned off and the switches SC3, SC4 are turned on relative to the states in the sampling operation. At the same time, either of the switches SDT, SDM and SDB in the second D/A converter 22 is turned on in accordance with the quantized value of the quantization circuit 30 thereby to feed back the quantized result. In this operation, the charge, which remains by removing the charge corresponding to the reference voltage VR supplied from the second D/A converter 22 from the charge stored in the second sampling capacitor Cs2 and the integration capacitor Cf in the sampling operation, is transferred to the integration capacitor Cf and stored in the integration capacitor Cf as the residual charge (residue). The operational amplifier 11 outputs the output voltage corresponding to the charge stored in the integration capacitor Cf and the quantization circuit 30 performs the A/D conversion.

In the cyclic processing, the sampling operation and the amplification operation are repeated a predetermined number of times thereby to perform the A/D conversion. For example, in a case of 12-bit A/D conversion, N bits are converted by the delta-sigma processing and 12−N bits are converted by the cyclic processing, thus completing 12-bit A/D conversion.

The A/D converter 100 according to the first embodiment provides the following advantages.

The A/D converter 100 is different from the conventional A/D converter in that the first DAC capacitor Cd1 of the first D/A converter 12 does not use the first sampling capacitor Cs1 as the sampling capacitor and the integration capacitor but is independent. Similarly, the second DAC capacitor Cd2 of the second D/A converter 22 does not use the second sampling capacitor Cs2 as the sampling capacitor and the integration capacitor but is independent. As a result, even when the leak current arises in the D/A converters 12 and 22, it is possible to restrict the leak current from affecting signal sampling, feedback loop on the output (quantized value) of the quantization circuit 30 and the output of the operational amplifier 11 in comparison to the conventional A/D converter, in which those capacitors are used in common.

Further, since the A/D converter 100 includes the separation switch SDC2, it is possible to separate the second D/A converter 22, which is provided in the cyclic processing, from the integration circuit in the delta-sigma processing. Thus it is possible to reduce lowering of the feedback factor and increase of the noise of the operational amplifier 11 in the delta-sigma processing performed by the second DAC capacitor Cd2. In addition, when the separation switch SDC2 is turned on, the second DAC capacitor Cd2 is connected in parallel to the second sampling capacitor Cs2 in relation to the switch SC2. As a result, it is possible to perform sampling and resetting of the second DAC capacitor Cd2 at the same time by the switch SC2 in the cyclic processing.

Further, since the A/D converter 100 includes the changeover switch SS3, it is possible to separate from the cyclic processing circuit 20 the first sampling capacitor Cs1 and the first D/A converter 12, which operate in the delta-sigma processing, in the delta-sigma processing. It is thus possible to reduce lowering of the feedback factor and increase of the noise of the operational amplifier 11 in the cyclic processing performed by the first sampling capacitor Cs1 and the first DAC capacitor Cd1.

Further, the A/D converter 100 includes no other switch between the inverting input terminal of the operational amplifier 11 and the integration capacitor Cf. That is, in the A/D converter 100, one end of the integration capacitor Cf is connected directly to the input of the operational amplifier 11. One side of the integration capacitor Cf connected to the inverting input terminal of the operational amplifier 11 is normally set to the AGND potential. For this reason, in a case that a switch is provided between the inverting input terminal and the integration capacitor Cf, it is likely that the on-resistance increases and lowers the operation speed of the circuit. In a case that an area for forming the switch is increased to lower the on-resistance, an increased area causes an increase in a parasitic capacitance and lowering of the feedback factor of the operational amplifier 11. The integration capacitor Cf, which is used in the delta-sigma processing and the cyclic processing and required to be connected to the inverting input terminal of the operational amplifier 11, is used commonly in both the delta-sigma processing and the cyclic processing. One end of the capacitor Cf is directly connected to the operational amplifier 11 always. As a result, it is possible to realize the A/D conversion at high speed and with high accuracy while reducing the area of layout.

Second Embodiment

In the first embodiment, the first D/A converter 12 for the delta-sigma processing and the second D/A converter 22 for the cyclic processing are exemplified as being provided separately. That is, the A/D converter 100 is exemplified as having two D/A converters 12 and 22.

Figure 10:
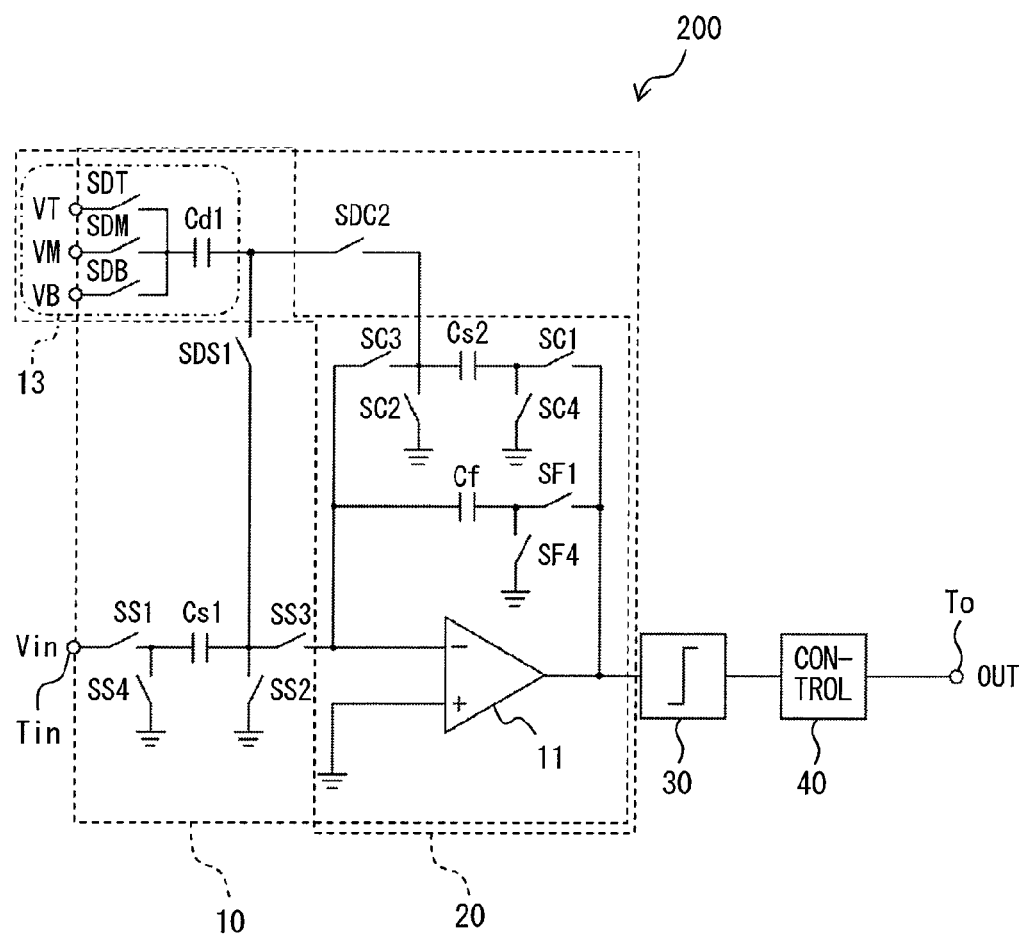
FIG. 10 is a circuit diagram showing a second embodiment of an A/D converter.

In a second embodiment, as shown in FIG. 10, an A/D converter 200 is exemplified as having only one D/A converter 13, which is used for both of the delta-sigma processing and the cyclic processing. The A/D converter 200 is configured similarly to the A/D converter 100 of the first embodiment except for the D/A converter 13. The DAC capacitor provided in the D/A converter 13 is referred to as Cd1 similarly to the first embodiment.

The A/D converter 200 is different from the A/D converter 100 of the first embodiment in that the second D/A converter is not provided and the first DAC capacitor Cd1 and the second sampling capacitor Cs2 are directly connected through the separation switch SDC2. Further, a separation switch SDS1 is provided between the first DAC capacitor Cd1 and the first sampling capacitor Cs1. The first DAC capacitor Cd1 is simply referred to as the DAC capacitor Cd1.

Although the D/A converter 13 is configured to be used to perform both the delta-sigma processing and the cyclic processing, the DAC capacitor Cd1 receives only the reference voltage VR at its one end and has no function of the sampling capacitor and the feedback capacitor. Thus it is possible to reduce the number of capacitors and maintain the accuracy of A/D conversion without being affected by the leak current of the D/A converter 13.

The operation of the A/D converter 200 according to the second embodiment will be described below. The operation of the second embodiment is the same as that of the first embodiment except for the operation of the separation switches SDC2 and SDS1 and hence the operations of the separation switches SDC2 and SDS1 in each operation phase will be described.

<Reset Operation>

The separation switch SDS1 and the switch SS2 are turned on by the control circuit 40 thereby to connect both ends of the DAC capacitor Cd1 to the AGND for discharging the DAC capacitor Cd1. When the separation switch SDS1 is turned on, the separation switch SDC2 is preferably turned off by the control circuit 40 so that the DAC capacitor Cd1 is separated from the feedback circuit.

<Sampling Operation in Delta-Sigma Processing>

The separation switch SDC2 is turned off and the separation switch SDS1 is turned on by the control circuit 40. Thus it is possible to separate the D/A converter 13 from the feedback circuit formed for the delta-sigma processing. On the other hand, the separation switch SDS1 is turned on so that the D/A converter 13 is connected in parallel to the first sampling capacitor Cs1 through the separation switch SDS1 relative to the switch SS2.

<Integration Operation in Delta-Sigma Processing>

In the delta-sigma processing, the D/A converter 13 need be separated from the feedback circuit. Therefore, similarly to the sampling operation, the separation switch SDC2 is turned off and the separation switch SDS1 is turned on by the control circuit 40 so that the D/A converter 13 is used for the D/A conversion in the delta-sigma processing.

<Sampling Operation in Cyclic Processing>

The separation switch SDC2 is turned on and the separation switch SDS1 is turned off by the control circuit 40 so that the D/A converter 13 is connected in parallel to the second sampling capacitor Cs2 through the separation switch SDC2 relative to the switch SC2.

<Amplification Operation in Cyclic Processing>

In the cyclic processing, similarly to the sampling operation, the separation switch SDC2 is turned on and the separation switch SDS1 is turned off by the control circuit 40 so that the D/A converter 13 is used for the D/A conversion in the cyclic processing.

Third Embodiment

Figure 11:
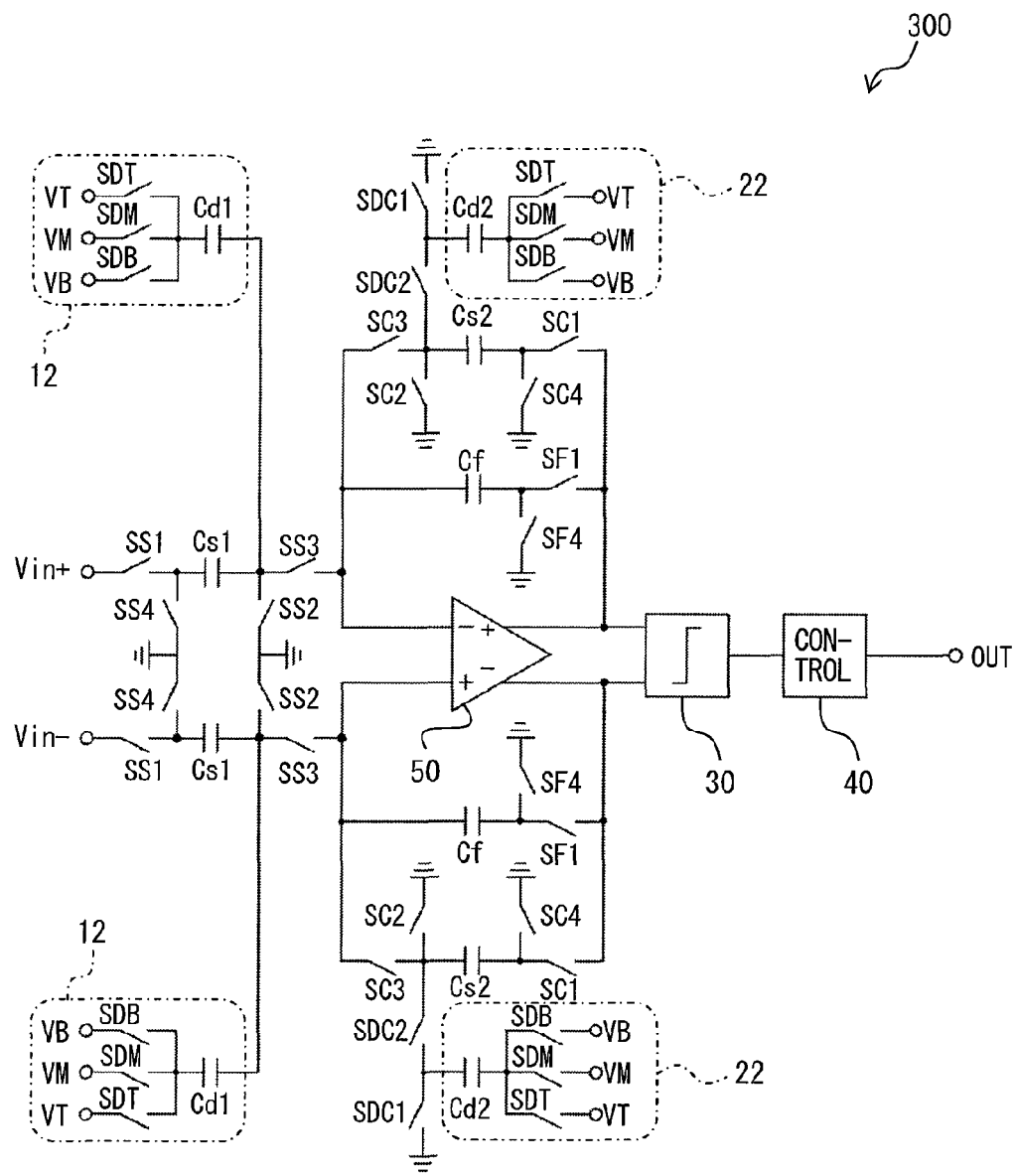
FIG. 11 is a circuit diagram showing a third embodiment of an A/D converter.

In the embodiments described above, the operational amplifier 11 is exemplified as an amplifier. However, as shown in FIG. 11, an A/D converter 300 is provided with a differential amplifier 50 in place of the operational amplifier 11. Analog input signals Vin+ and Vin−, which are opposite in polarity to each other, are inputted to improve the accuracy of A/D conversion. Each of two circuits for processing the analog input signal Vin+ and the analog input signal Vin− is the same as that of the first embodiment. The operation of each switch is the same as that of the first embodiment. Hence, the switches provided for processing the analog input signal Vin+ and for processing the analog input signal Vin− are designated with the same reference numerals.

The A/D converter described above with reference to the preferred embodiments is not limited to the disclosed embodiments but may be implemented with various modifications.

What is claimed is:
1. An A/D converter comprising:
a delta-sigma processing circuit for receiving an analog input signal for A/D conversion of the analog input signal by delta-sigma processing of delta-sigma modulation;

a cyclic processing circuit for A/D converting, by cyclic processing, a difference between an amplified residue of quantization generated in the A/D conversion and a reference voltage;

a quantization circuit for outputting a quantized value of a quantized output of the delta-sigma circuit and a quantized output of the cyclic processing circuit; and a control circuit for generating an A/D conversion result of the analog input signal based on the quantized value and outputting a control signal for switching over the reference voltage, wherein the delta-sigma processing circuit and the cyclic processing circuit include an operational amplifier forming an operation circuit, sampling capacitors, a capacitive D/A converter having a DAC capacitor for adding and subtracting the residue of quantization based on the reference voltage corresponding to the control signal, the delta-sigma processing circuit includes an integration capacitor used for the delta-sigma processing and the cyclic processing, and the sampling capacitors, the DAC capacitor and the integration capacitor are provided to be electrically separated.

2. The A/D converter according to claim 1, further comprising:

a separation switch provided between the sampling capacitor and the DAC capacitor to connect and disconnect the sampling capacitor and the DAC capacitor.

3. The A/D converter according to claim 2, wherein:

the separation switch is connected directly to the sampling capacitor without through any other switches.

4. The A/D converter according to claim 1, wherein:

the delta-sigma processing circuit includes the operational amplifier forming the operation circuit, a first sampling capacitor connected to an input terminal of the operational amplifier as the sampling capacitor to sample the analog input signal, an integration capacitor connected between the input terminal and an output terminal of the operational amplifier to form an integration circuit with the operational amplifier and the first sampling capacitor, and a first D/A converter connected in parallel to the first sampling capacitor as the D/A converter relative to the input terminal of the D/A converter;

the first D/A converter includes a first DAC capacitor provided separately from the first sampling capacitor to add and subtract the residue to be quantized based on the reference voltage;

the cyclic processing circuit includes the operational amplifier used commonly in the delta-sigma processing circuit, the integration capacitor used commonly in the delta-sigma processing circuit, a second sampling capacitor connected to the operational amplifier and the integration capacitor as the sampling capacitor, and a second D/A converter connected to one of terminals of the second sampling capacitor, which is at a side of the input terminal of the operational amplifier;

the second D/A converter includes a second DAC capacitor provided separately from the second sampling capacitor to add and subtract the residue to be quantized based on the reference voltage, and a separation switch provided between the first sampling capacitor and a node between the operational amplifier and the integration capacitor to connect and disconnect the first sampling capacitor and the node between the operational amplifier and the integration capacitor.

5. The A/D converter according to claim 1, wherein:

the D/A converter is a common part of the delta-sigma processing circuit and the cyclic processing circuit.

6. The A/D converter according to claim 1, wherein:

one end of the integration capacitor is connected directly to the input terminal of the operational amplifier without through any other switches.

* * * * *